United States Patent [19]

Lacy et al.

[11] Patent Number: 4,884,242

[45] Date of Patent: Nov. 28, 1989

[54] BACKUP POWER SYSTEM FOR DYNAMIC MEMORY

[75] Inventors: Robert H. Lacy; William A. Spencer, both of Bartlesville, Okla.

[73] Assignee: Applied Automation, Inc., Bartlesville, Okla.

[21] Appl. No.: 199,980

[22] Filed: May 26, 1988

[51] Int. Cl.[4] .............................................. G11C 11/40
[52] U.S. Cl. ....................................... 365/229; 371/66
[58] Field of Search ............................ 365/229; 371/66

[56] References Cited

U.S. PATENT DOCUMENTS 4,777,626 10/1988 Matsushita et al. .................. 365/229
4,823,019 4/1989 Gronskog et al. ................... 365/229

Primary Examiner—Terrell W. Fears

Attorney, Agent, or Firm—Laney, Dougherty, Hessin & Beavers

[57] ABSTRACT

A power supply system for a dynamic memory includes a main power supply, a backup power supply and a power down detection circuit which are all connected in parallel across the input of a DC/DC converter. In turn the DC/DC converter supplies regulated power to the dynamic memory. On interruption of the main power supply, the backup supply provides input power to the DC/DC converter only as long as the power sensed by the power down detection circuit is adequate for the DC/DC converter to maintain a bit pattern stored in the dynamic memory. On sensing inadequate input power to the DC/DC converter the backup supply is automatically disconnected.

13 Claims, 2 Drawing Sheets

BACKUP POWER SYSTEM FOR DYNAMIC MEMORY

This invention relates to electronic circuits. In one aspect it relates to circuitry for maintaining a continuous supply of electrical power to a dynamic memory which is included in a computer system. In another aspect it relates to a method of switching to a backup power source upon loss of the main power source. In a further aspect it relates to a method of disconnecting a backup power source when the backup power source lacks capacity to maintain the bit pattern stored in a dynamic memory.

As used herein a dynamic memory is a type of semiconductor memory in which the presence or absence of a capacitive charge represents the state of a binary storage element. This charge must be perodically refreshed to maintain the bit pattern stored in the dynamic memory.

A dynamic random access memory (DRAM) is superior to a static RAM because the DRAM provides a greater memory capacity for a lower cost. However, the DRAM consumes more electric power than a static RAM since peripheral refresh circuits are required for dynamic memory retention. If a DRAM is employed for storage of critical information in a computer system a relatively large amount of electric power must be continuously supplied to refresh the DRAM.

Accordingly it is an object of this invention to provide regulated electric power to a DRAM system even when the main DC power supply is terminated.

It is a further object of this invention to utilize a rechargeable storage battery to backup power supplied to the DRAM system in the event the main DC power supply is terminated.

Another object of this invention is to efficiently use the energy stored in the backup battery.

Yet another object of this invention is to extend the service life of the backup battery.

Still another object of this invention is to rapidly recharge the backup battery in a safe manner.

In accordance with this invention apparatus and method are provided for continuously supplying power to a dynamic memory which receives power from a DC/DC converter. This is accomplished by supplying input power to the DC/DC converter from a main DC power supply and for automatically switching to a backup supply upon loss of the main DC power supply. Further a power down detector circuit is provided which detects when the input power to the DC/DC converter is below a predetermined level. The predetermined power level is selected such that a power level below this predetermined level prevents the DC/DC converter from supplying sufficient DC power to the dynamic memory to maintain a bit pattern stored in the memory. Upon detection of a power condition in which the actual power supplied to the input of the DC/DC converter is less than the selected predetermined level, the backup supply is automatically disconnected from the DC/DC converter.

In the presently preferred embodiment the voltage of the main DC power supply is impressed in parallel fashion across: (1) a switching mode DC/DC converter which supplies power to the critical DRAM load, (2) a power down detection circuit for the DC/DC converter which operates an associated relay, and (3) a series branch circuit for charging a backup battery through an incandescent lamp and a normally open contact of the power down detection relay. Appropriate blocking diodes are also provided to prevent current from flowing into the main DC power supply.

On power failure, the voltage of the main DC power supply falls to zero. However the backup battery, which is connected in parallel with the main DC power supply, automatically supplies power to the DC/DC converter through its series connected diode and relay contact. The backup battery also supplies current to the power down voltage detection circuit for operating its relay.

If the main DC power supply is interrupted for a long period, the backup battery will supply current to the DC/DC converter until the battery voltage drops below the preselected level. At this point, the power down detection circuit will sense the low voltage condition where the backup battery has insufficient capacity to supply the voltage necessary to retain data in the DRAM system. The relay contact is then switched, thereby disconnecting the battery from the DC/DC converter to prevent a deep discharge of the battery. On restoration of power, the main DC power supply resumes its original loads. Because the backup battery is in some state of discharge when power is restored, a large charging current to the backup battery could overload the main DC power supply. However, the large positive temperature coefficient provided by the tungsten filament of the series connected incandescent lamp causes its resistance to increase rapidly with temperature thereby limiting the battery charging current to a safe value.

Other objects and advantages of the invention will be apparent from the foregoing brief description of the invention and the claims as well as the detailed description of this invention and the drawings in which:

This invention is described in terms of specific electronic components and a battery which are for illustration only, since reasonable variations and modifications by those skilled in electronic circuit arts are within the scope of the described invention and the appended claims.

Figure 1:
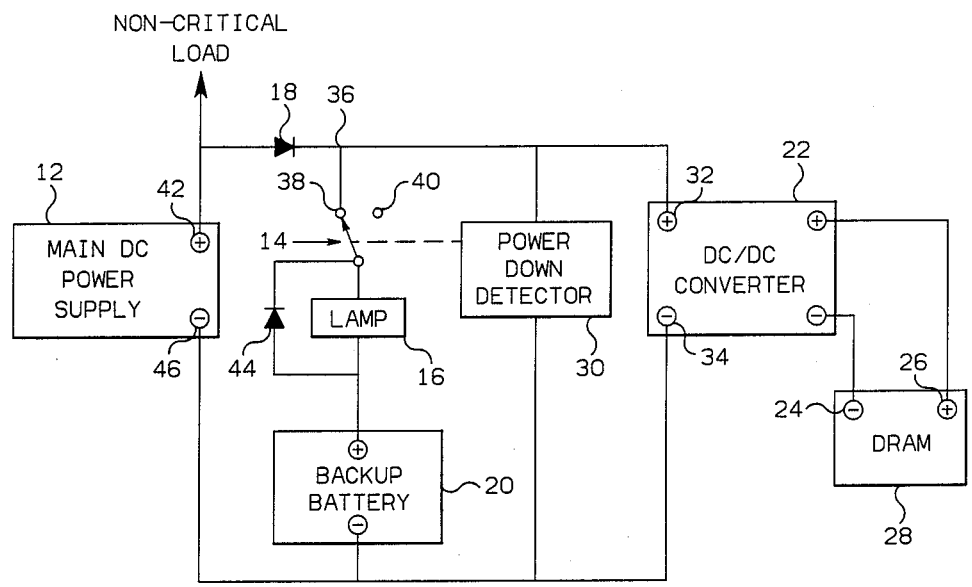
FIG. 1 is a block diagram of a battery backup system according to this invention.

Referring now to the drawings and in particular to FIG. 1, there is illustrated a regulated main DC power supply 12 connected to supply battery charging current through a relay switch 14, an incandescent lamp 16, and a Schottky diode 18, to a backup battery 20. Diode 44 which is preferably a Schottky diode is connected in parallel with lamp 16.

A switching mode DC/DC converter 22, also connected to receive power from the main DC power supply 12, is provided for changing the voltage of the main DC power supply 12 or backup battery 20 to efficiently supply a suitable regulated voltage to the power source terminals 24 and 26 of a DRAM system 28. The main DC power supply 12 may suitably be the power supply for other non-critical loads associated with the computer system. However, the backup battery 20, which may be any suitable rechargeable type, supplies power only to the DC/DC converter 22. The capacity of the backup battery 20 is selected to supply the DRAM system for a desired length of time. Preferably the voltage of the backup battery 20, and the output voltage of the main DC power supply are jointly selected such that the ideal float charge for the backup battery 20 is matched to the nominal output voltage of the main DC power supply 12. Voltage matching of the main DC power supply and the backup battery improves battery service life while also reducing production and maintenance costs.

Also illustrated in FIG. 1 is a "power down" detection circuit 30 connected to the power source terminals 32 and 34 of the DC/DC converter 22 and to the circuit node 36 which connects to the cathode of blocking diode 18. As used herein a "power down" detector is a circuit that is effective for detecting a condition of input power below a predetermined level. In practice this power down detector preferably comprises a voltage detector with a threshold set in accordance with the particular DC/DC converter employed. For example, if the DC/DC converter requires an input voltage between 18 and 8 volts DC to maintain its nominal output capacity, a voltage threshold slightly greater than 8 volts insures the integrity of the stored data. Since loss of the stored data is imminent at a voltage level of 8 volts this threshold level slightly greater than 8 volts would properly activate a power down situation. The detector 30 is connected to operate relay switch 14 which has normally open pole position 38 and normally closed position 40. The power down detector normally holds the pole of switch 14 in position 38. However, on a low battery voltage condition such as would occur during an extended interruption of the main DC power supply 12, the pole of switch 14 is switched to its normally closed position 40, thereby disconnecting the backup battery from the circuit. Since loss of the data stored in the DRAM system is imminent on detection of a low voltage condition, the power down feature prevents a needless deep discharge of the backup battery thereby extending the service life of the battery and also allowing a short recharge period to recover full backup capacity.

Figure 2:
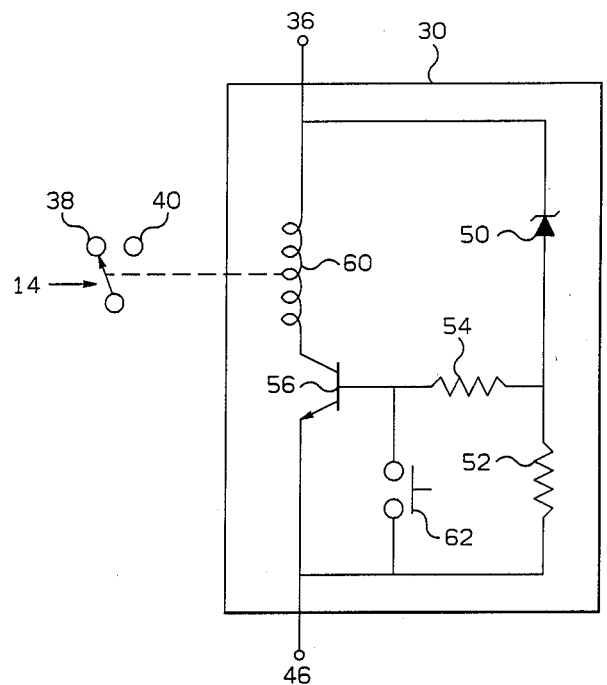
FIG. 2 is a schematic circuit diagram of the power down detector illustrated in FIG. 1.

In FIG. 2 there is illustrated a schematic diagram for the power down detector 30 illustrated in FIG. 1. Reference numerals for corresponding components diagrammed in FIG. 1 are retained in FIG. 2. A zener diode 50 for which the zener voltage is preferably slightly lower than the desired threshold voltage is connected from node 36 through a resistor 52 to the negative power supply terminal 46. The anode of zener diode 50 is further connected through resistor 54 to the base of transistor 56. The emitter of transistor 56 is connected to the negative power supply terminal 46. The collector of transistor 56 is connected to one end of relay coil 60, with the other end of relay coil 60 connected to node 36. Relay coil 60 controls the position of relay switch 14 which is also illustrated in FIG. 1.

In normal operation the main DC power supply 12 applies a voltage across zener diode 50 in excess of its breakdown voltage thereby causing current flow to the base of transistor 56. Transistor 56 conducts causing current flow through relay coil 60 which holds the pole of relay switch 14 in position 38.

In battery backup operation the backup battery 20 applies a breakdown voltage across zener diode 50 through diode 44 and holds the pole of relay switch 14 in position 38.

In power down operation the main DC power supply 12 is terminated, and the backup battery lacks capacity to provide a breakdown voltage for zener diode 50. Without current supplied through zener diode 50, transistor 56 is non-conductive thereby releasing the pole of relay switch 14 from its normally open position 38 to its normally closed position 40 and thereby disconnecting backup battery 20. Also momentary switch 62 is provided to short circuit the base of transistor 56 to disconnect backup battery 20 as desired for maintenance, storage, shipping or other purposes.

Electrical components which can be utilized in the circuits illustrated in FIGS. 1 and 2 are as follows:

| Component | Description |
| --- | --- |
| Power supply, 12 | Cherokee International, Inc. Model QX5B1BCDKS (+12 V output) |
| Diodes, 18,44 | National Semiconductor, 1N5831 |
| Lamp 16 | Automotive type 1034 |
| Battery, 20 | Eagle-Picher Industries, Model CF 10V5 |
| DC/DC Converter, 22 | Semiconductor Circuits, Model V SW11-400-1E |
| DRAM, 28 | Chrislin Industries, 2 Mega Byte Multibus Memory Board Model C1796EDC |
| Zener diode, 50 | Motorola, 1N4737A |
| Transistor, 56 | National Semiconductor, 2N3904 |
| Resistors, 52,54 | 2.2 K Ohms |
| Switch, 62 | C & K Components, Push Button, N.O. Contacts |
| Relay, (30,14,38,40) | Omron Electronics, Model GGC-2117P |

The invention has been illustrated and described in terms of a preferred embodiment as illustrated in FIGS. 1 and 2. As has been previously discussed, reasonable variations and modifications are possible by those skilled in electronic circuit are within the scope of the disclosure of the appended claims.

That which is claimed is:

1. Apparatus for continuously supplying DC power to a dynamic memory said apparatus comprising:
   a DC/DC converter connected to said dynamic memory, wherein said DC/DC converter supplies regulated DC power to said dynamic memory to maintain a bit pattern stored in said dynamic memory;
   a main DC power supply connected to said DC/DC converter, wherein said main DC power supply supplies input power to said DC/DC converter;
   a backup DC power supply to backup the power supplied to said DC/DC converter by said main DC power supply;
   a power down detector circuit for detecting when input power to said DC/DC converter is below a predetermined level, wherein an input power level for said DC/DC converter that is below said predetermined level prevents said DC/DC converter from supplying sufficient DC power to said dynamic memory to maintain said bit pattern stored in said dynamic memory;
   means coupled to said power down detector circuit for immediately supplying backup power from said backup DC power supply when said input power from said main DC power supply is interrupted; and
   means for automatically disconnecting said backup DC power supply when the input power for said DC/DC converter falls below said predetermined level.

2. Apparatus in accordance with claim 1 wherein said DC/DC converter is a switching type converter.

3. Apparatus in accordance with claim 1 wherein said backup DC power supply is a rechargeable storage battery, said apparatus additionally comprising:

an incandescent lamp; and means for charging said rechargeable storage battery when said main DC power supply supplies input power to said DC/DC converter, and wherein charging current for said rechargeable storage battery is supplied from said main DC power supply through said incandescent lamp.

4. Apparatus in accordance with claim 3 additionally comprising:

a first diode connected to prevent current flow from said storage battery to said main DC power supply; and a second diode connected to prevent current flow through said incandescent lamp when said storage battery supplies power to said DC/DC converter.

5. Apparatus in accordance with claim 2 wherein said rechargeable storage battery is a lead-acid type storage battery, and said first diode and said second diode are Schottky diodes.

6. Apparatus in accordance with claim 5 wherein the output voltage of said main DC power supply is matched to the ideal float charge voltage of said rechargeable storage battery.

7. Apparatus in accordance with claim 1 wherein said DC/DC converter has a positive power source terminal and a negative power source terminal for receiving DC power from said main DC power supply or from said backup DC power supply and wherein said power down detector is a voltage detector comprising:

a zener diode having an anode and a cathode, said cathode being connected to said positive power source terminal of said DC/DC converter and said anode being connected to a first end of a first resistor with a second end of said first resistor being connected to said negative power source terminal of said DC/DC converter;

an NPN transistor having a base, a collector and an emitter, said emitter being connected to said negative power source terminal of said DC/DC converter, and said base being connected to a first end of a second resistor with a second end of said second resistor being connected to said anode of said zener diode; and an electrical relay including a relay coil with an associated single pole double throw relay switch, a first end of said relay coil being connected to said collector of said NPN transistor and a second end of said relay coil being connected to said positive power source terminal.

8. Apparatus in accordance with claim 7 wherein said means coupled to said power down detector circuit for immediately supplying backup power from said backup DC power supply when said main DC power supply is interrupted comprises:

means for connecting said backup power supply through said relay switch associated with said power down circuit to said positive power source terminal of said DC/DC converter.

9. A method for continuously supplying DC power to a memory, said method comprising the steps of:

supplying regulated power to said memory from a main DC/DC converter;

supplying DC input power to said DC/DC converter from a main DC power supply;

supplying backup power from a backup DC power supply when said input power from said main DC power supply is interrupted;

detecting when the input power to said DC/DC converter is below a predetermined power level, wherein an input power level for said DC/DC converter that is below said predetermined level prevents said DC/DC converter from supplying sufficient DC power to said memory to maintain a bit pattern stored in said memory;

terminating said backup DC power supplied from said backup DC power supply when the input power to said DC/DC converter falls below said predetermined level.

10. A method in accordance with claim 9 wherein said backup DC power supply is a rechargeable storage battery said method comprising the additional steps of:

charging said rechargeable battery wherein the charging current is supplied through an incandescent lamp.

11. A method in accordance with claim 10 additionally comprising the steps of:

matching the output voltage of said main DC power supply to the ideal float charge voltage of said storage battery.

12. A method in accordance with claim 9 wherein said step of detecting when the input source to said DC/DC converter is below a predetermined level comprises:

using a zener diode for setting a threshold voltage in accordance with the minimum operating voltage specified for said DC/DC converter, wherein a voltage above said threshold voltage corresponds to the input power to said DC/DC converter being above said predetermined power level and a voltage below said threshold voltage corresponds to the input power to said DC/DC converter being below said predetermined power level;

connecting said zener diode across the input of said DC/DC converter wherein current flows through said zener diode if said input voltage of said DC/DC converter is above said threshold, and wherein no current flows through said zener diode if said input voltage of said DC/DC converter is below said threshold;

connecting a relay, having a switch with a normally open position and a normally closed position, to respond to current through said zener diode;

holding said relay switch in said normally open position when current flows through said zener diode; and releasing said relay switch to said normally closed position when no current flows through said zener diode.

13. A method in accordance with claim 12 wherein said step of supplying backup power from said DC power supply when said main DC power supply is interrupted comprises:

connecting said backup power supply to said DC/DC converter through said normally open position of said relay switch.

* * * * *